(12) United States Patent
Yamamoto

(10) Patent No.: US 6,380,070 B1
(45) Date of Patent: Apr. 30, 2002

(54) SEMICONDUCTOR DEVICE HAVING A DUAL DAMASCENE INTERCONNECT STRUCTURE AND METHOD FOR MANUFACTURING SAME

(75) Inventor: Koji Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/359,873

(22) Filed: Jul. 27, 1999

Related U.S. Application Data

(62) Division of application No. 09/241,461, filed on Feb. 2, 1999.

(30) Foreign Application Priority Data

Feb. 3, 1998 (JP) .............................. 10-021810

(51) Int. Cl.⁷ .......................................... H01L 21/4763
(52) U.S. Cl. ....................... 438/634; 438/637; 438/638
(58) Field of Search ................ 438/637, 638, 438/634

(56) References Cited

U.S. PATENT DOCUMENTS

| | | |
|---|---|---|
| 5,528,081 A | 6/1996 | Hall |
| 5,600,182 A | 2/1997 | Schinella et al. |
| 5,703,403 A | 12/1997 | Sobue et al. |
| 5,705,430 A * | 1/1998 | Avanzino et al. ............ 437/195 |
| 5,739,579 A * | 4/1998 | Chiang et al. ............... 257/635 |
| 5,773,890 A | 6/1998 | Uchiyama et al. |
| 5,808,365 A | 9/1998 | Mori |
| 5,817,572 A * | 10/1998 | Chiang et al. ............... 438/637 |
| 5,850,102 A | 12/1998 | Matsuno |
| 5,852,328 A | 12/1998 | Nishimura et al. |
| 5,880,519 A | 3/1999 | Bothra et al. |
| 5,883,433 A | 3/1999 | Oda |
| 5,889,302 A | 3/1999 | Liu |
| 5,960,320 A * | 9/1999 | Park ............................ 438/688 |
| 6,042,999 A * | 3/2000 | Lin et al. ..................... 430/316 |
| 6,251,770 B1 * | 6/2001 | Uglow et al. ................ 438/624 |

FOREIGN PATENT DOCUMENTS

JP 5-46983 7/1993

* cited by examiner

Primary Examiner—John F. Niebling
Assistant Examiner—Lynne A. Gurley
(74) Attorney, Agent, or Firm—Hoffmann & Baron, LLP

(57) ABSTRACT

A semiconductor device includes a first interlayer film of SiN and a second interlayer film of $SiO_2$ that are formed in the order over a semiconductor substrate having, at a surface, a conductive layer. In the same or different etching process, a contact or via hole is formed through the first interlayer film above the conductive layer, while an interconnect trench is formed through the second interlayer film.

5 Claims, 5 Drawing Sheets

SEMICONDUCTOR DEVICE HAVING A DUAL DAMASCENE INTERCONNECT STRUCTURE AND METHOD FOR MANUFACTURING SAME

CROSS REFERENCE TO RELATED APPLICATIONS

This application is a Divisional Application of co-pending U.S. application Ser. No. 09/241,461, filed on Feb. 2, 1999.

BACKGROUND OF THE INVENTION

1. Field of the Invention

The present invention relates to a semiconductor device and a method for manufacturing same. More particularly, the invention relates to a semiconductor device having a contact or via hole formed through a first interlayer film on a semiconductor substrate and an interconnect trench formed through a second interlayer film over the first interlayer film in a manner opened to the contact or via hole so that a conductive material is buried inside the contact or via hole and the interconnect trench, and a method for manufacturing the same device.

2. Description of the Prior Art

There is disclosed a semiconductor device of this kind which is manufactured through utilizing a dual damascene process, for example, in Japanese Patent Publication No. H5-46983. The semiconductor device according to the prior art is shown in FIG. 1.

The semiconductor device includes a semiconductor substrate 2. On the semiconductor substrate 2 are formed, in order, a first interlayer film 3a, an etch stop film 3b and a second interlayer film 3c. A contact or via hole 5a is formed through the first interlayer film 3a and the etch stop film 3b so that the hole 5a is opened to a conductive region 4 formed in a surface of the semiconductor substrate 2. Meanwhile, an interconnect trench 5b is formed through the second interlayer film 3c including a region around above the contact hole 5a. A metal interconnect 6 is buried inside the contact hole 5a and the interconnect trench 5b. Incidentally, the etch stop film 3b also serves to prevent copper (Cu), etc. forming the metal interconnect 6 from diffusing outside.

To manufacture such a semiconductor device, a conductive region 4 is formed in a surface of the semiconductor substrate 2 using polysilicon or the like, as shown in FIG. 2A. A first interlayer film 3a and an etch stop layer 3b are formed over the semiconductor substrate 2, and a window 7 is formed through the etch stop film 3b. Subsequently, a second interlayer film 3c is formed over the etch stop film 3b, as shown in FIG. 2B. Then the first interlayer film 3a, together with the second interlayer film 3c, is masked by and etched through patterned photoresist 8, thereby forming a contact hole 5a as well as an interconnect trench 5b, as shown in FIG. 2C.

After removing the photoresist 8, a metal interconnect 6 is formed by burying an inside of the contact hole 5a and the interconnect trench 5b with using copper (Cu), aluminum (Al) or the like, as shown in FIG. 2D. The metal interconnect 6 at its unwanted portions is removed by implementing a CMP (Chemical-Mechanical Polish) process.

The conventional semiconductor device has required an etch stop film 3b as stated above. However, this results in a problem that here encounters troublesomeness in the manufacturing process due to a complicated three-layered structure despite the interconnect trench 5b can be formed even in depth.

SUMMARY OF THE INVENTION

It is therefore a primary object of the present invention to provide a novel semiconductor device and manufacturing method therefor.

It is another object of the present invention to provide a semiconductor device and manufacturing method by which simplification is available for the device structure.

A semiconductor device according to the present invention comprises: a first interlayer film; a contact hole formed through the first interlayer film by etching the first interlayer film; a second interlayer film formed over a surface of the first interlayer film; and an interconnect trench formed through the second interlayer film by etching the second interlayer film and opened to the contact hole, wherein the first interlayer film as an etch rate lower than an etch rate of the second interlayer film.

The first interlayer film is formed, for example, of SiN, and accordingly lower in etch rate than the second interlayer film. Due to this, the first interlayer film behaves as an etch stop during etching the second interlayer film. Therefore there is no necessity of separately providing an etch stop film between the first interlayer film and the second interlayer film. According to this invention, it is possible to simplify the device structure and hence the manufacture process.

If the first interlayer film is formed by a nitride film having a high molecular density, the first interlayer film can be utilized also as a diffusion prevention film.

The first etching process and the second etching process may be in a common process or separate process from each other.

A method for manufacturing a semiconductor device according to the present invention, comprises the steps of: forming a first interlayer film over a semiconductor substrate; forming a second interlayer film over a surface of the first interlayer film; etching the second interlayer film by utilizing the first interlayer film as an etch stop to thereby form an interconnect trench; and etching the first interlayer film to form a contact hole opened to the interconnect trench.

Another method for manufacturing a semiconductor device according to the present invention, comprises the steps of: forming a first interlayer film over a semiconductor substrate; etching the first interlayer film to form a contact hole; forming a second interlayer film on a surface of the first interlayer film; and etching the second interlayer film by utilizing the first interlayer film as an etch stop to thereby form an interconnect trench opened to the contact hole.

In either manufacturing method, the first interlayer serves as not only a layer to form a contact or via hole but also an etch stop layer in etching the second interlayer film. Accordingly, there is no necessity to separately provide an etch stop layer over the first interlayer film, thus simplifying the manufacturing process.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
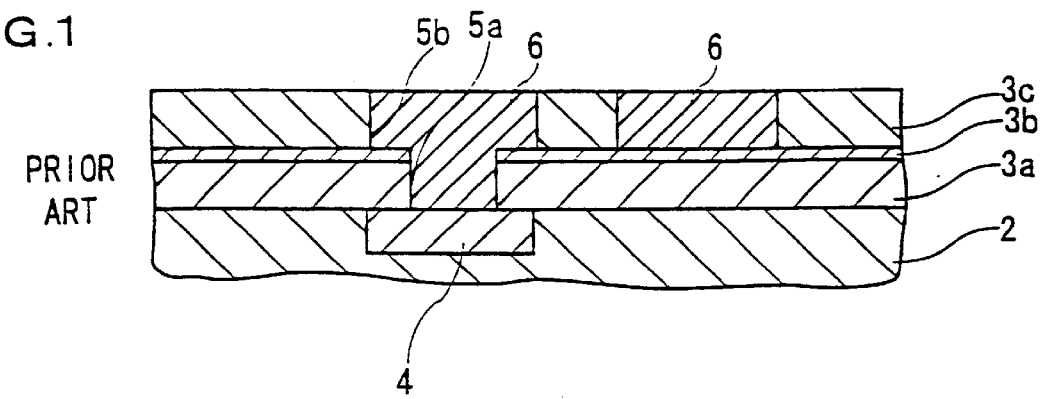
FIG. 1 is an illustrative view showing a conventional semiconductor device.
Figure 2A:
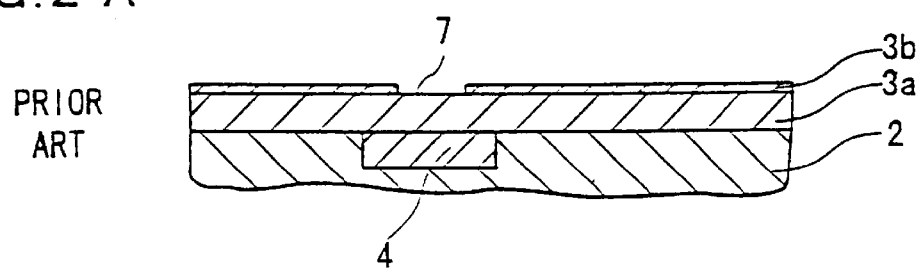
FIGS. 2A–2D are illustrative views showing a method for manufacturing semiconductor device of FIG. 1.
Figure 2B:
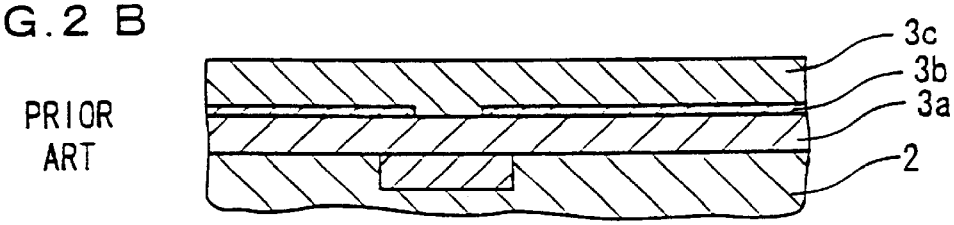
Figure 2C:
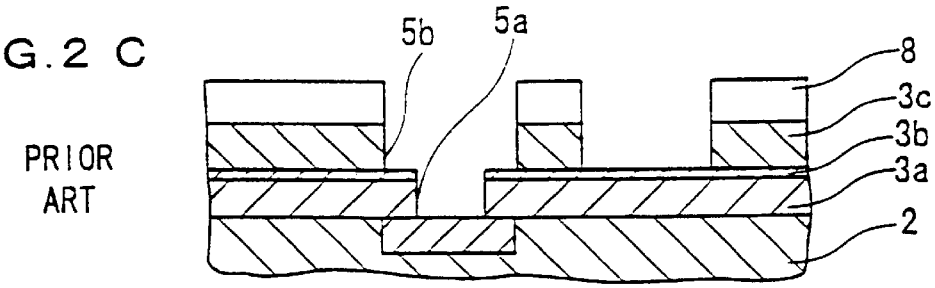
Figure 2D:
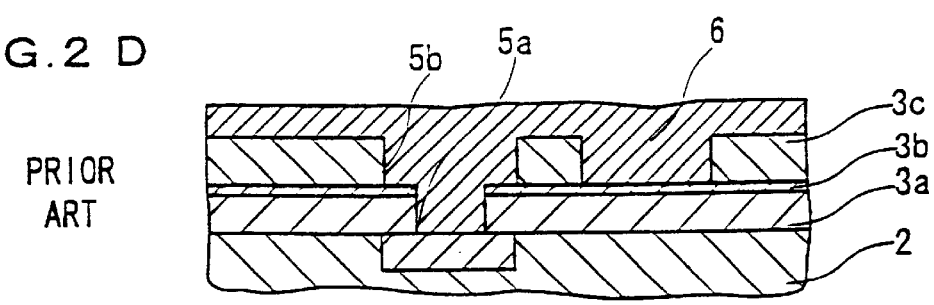
Figure 3:
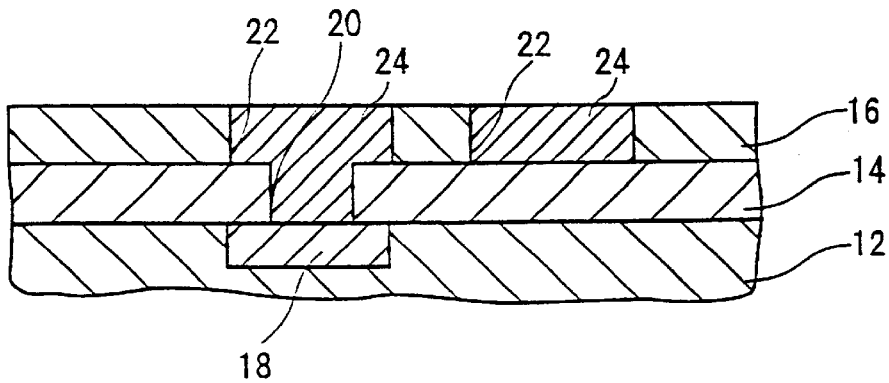
FIG. 3 is an illustrative view showing one embodiment of the present invention.

A semiconductor device 10 in this embodiment shown in FIG. 3 includes a semiconductor substrate 12 formed of silicon (Si) or the like. The semiconductor substrate 12, however, may be formed of another arbitrary material. A first interlayer film 14 of silicon nitride (SiN) and a second interlayer film 16 of silicon oxide ($SiO_2$) are formed in the order on the semiconductor substrate 12. The first interlayer film 14 is formed therethrough with a via or contact hole 20 opened down to a conductive region 18 formed at a surface of the semiconductor substrate 12. Meanwhile, an interconnect trench 22 is formed through the second interlayer film 16 that includes a region around above the contact hole 20. The contact hole 20 and the interconnect trench 22 at their insides are buried by a conductive material, such as copper (Cu) or aluminum (Al), thus forming a metal interconnect 24.

The semiconductor device 10 in the embodiment of FIG. 3 can be manufactured by a process utilizing so-called a dual damascene technique, as described below.

Figure 4A:
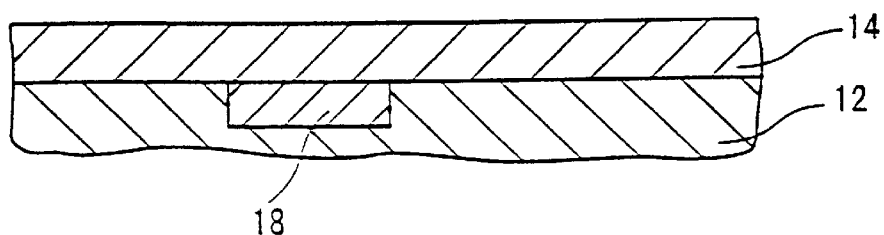
FIGS. 4A–4F are illustrative views showing, in the process order, a method for manufacturing a device of the FIG. 3 embodiment

First, a first interlayer film 14 is formed by sputtering or the like over a semiconductor substrate 12 that is formed, at a surface, with a conductive region 18 of polysilicon or the like, as shown in FIG. 4A. The first interlayer film 14 is formed of silicon nitride (SiN) that is high in molecular density.

Figure 4B:
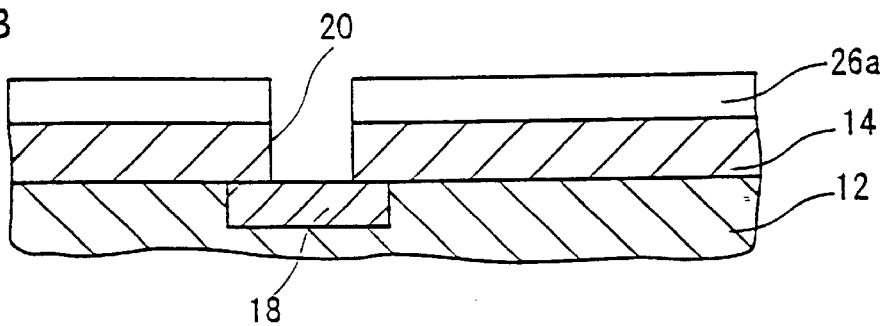

Then, the first interlayer film 14 is masked by and etched through patterned photoresist 26a, as shown in FIG. 4B. Thus a via or contact hole 20 is formed which is opened to the conductive region 18.

Figure 4C:
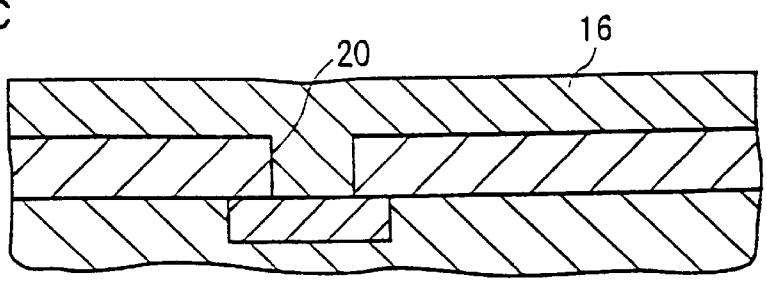

After removing the photoresist 26a away, a second interlayer film 16 is formed of silicon oxide ($SiO_2$) or the like in a manner burying the contact hole 20 by a CVD process, as shown in FIG. 4C.

Figure 4D:
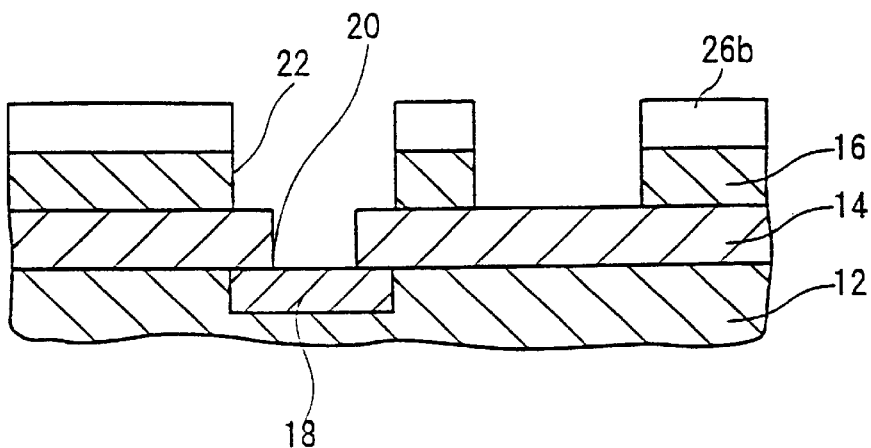

The second interlayer film 16 is masked by and etched through patterned photoresist 26b as shown in FIG. 4D, thereby forming an interconnect trench 22 that is opened to the contact hole 20. This etching process is carried out by selecting such an etching gas or etching solution in kind that the etch rate on the first interlayer film 14 is lower than that of the second interlayer film 16. Due to this, the first interlayer film 14 is allowed to behave as an etch stop when performing an etching process on the second interlayer film 16 in FIG. 4D.

Figure 4E:
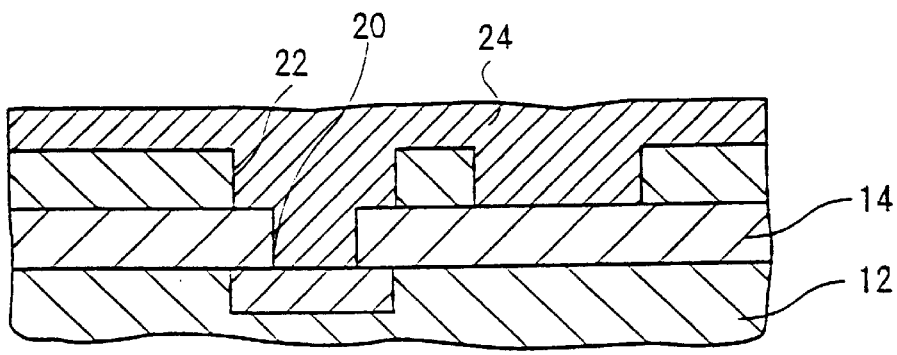
Figure 4F:
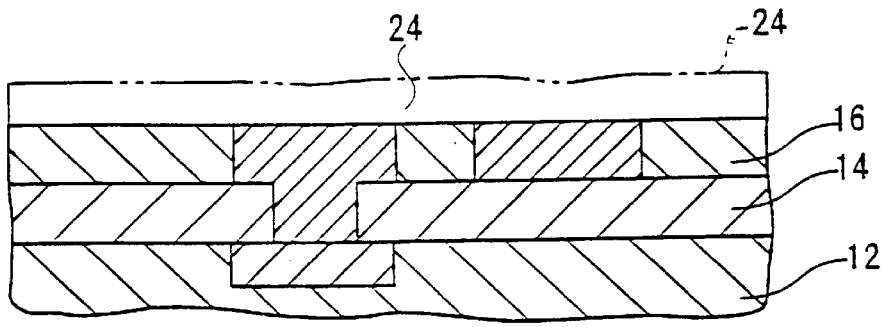

Thereafter, an interconnect 24 is formed by sputtering a conductive material, such as copper (Cu) or aluminum (Al), to bury the inside of the contact hole 20 and interconnect trench 22, thereby forming a metal interconnect 24 as shown in FIG. 4E. Thereafter, the conductive material or metal interconnect 24 at unwanted portions is removed by implementing a CMP (Chemical-Mechanical Polish) process or the like.

According to this embodiment, when etching the second interlayer film 16 to form the interconnect trench 22, the first interlayer film 14 serves as an etch stop. Accordingly, there is no necessity to separately provide an etch stop film as was required in the prior art process. It is therefore possible to simplify the semiconductor device structure as well as the manufacturing process therefor.

Also, because the first interlayer film 14 is formed of silicon nitride (SiN) or the like that is high in molecular density, it is also possible to utilize the first interlayer film 14 as a diffusion prevention film to prevent the copper (Cu) forming the metal interconnect 24 from diffusing outside.

Incidentally, in the embodiment shown in FIGS. 4A–4F, the second interlayer film was formed after etching the first interlayer film, and then the second interlayer film was etched. However, the semiconductor device 10 may be manufactured by another manufacturing method as shown in FIGS. 5A–5E, wherein the first interlayer film and the second interlayer film are first formed and then the second interlayer film and the first interlayer film are etched in the order.

Figure 5A:
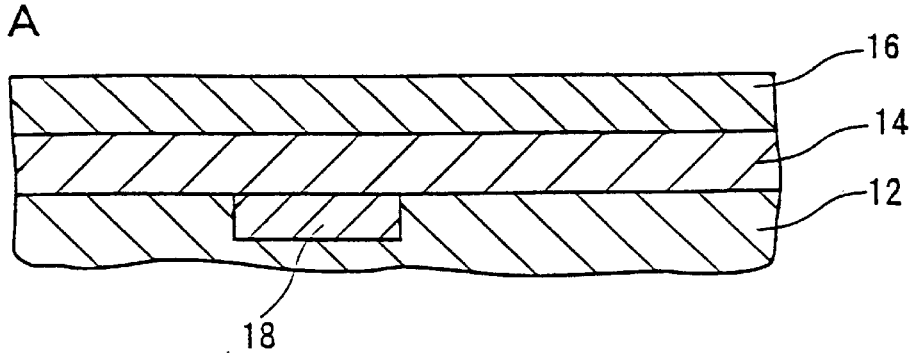
FIGS. 5A–5E are illustrative views showing, in the process order, another method for manufacturing the device of the FIG. 3 embodiment.

In this embodiment, as shown in FIG. 5A a first interlayer film 14 of silicon nitride (SiN) or the like that is high in molecular density is formed by spattering or the like over a semiconductor substrate 12 having a conductive region 18 formed of polysilicon or the like in a manner similar to FIG. 4A. Then a second interlayer film 16 of silicon oxide ($SiO_2$) is formed by the CVD process over the first interlayer film 14.

Figure 5B:
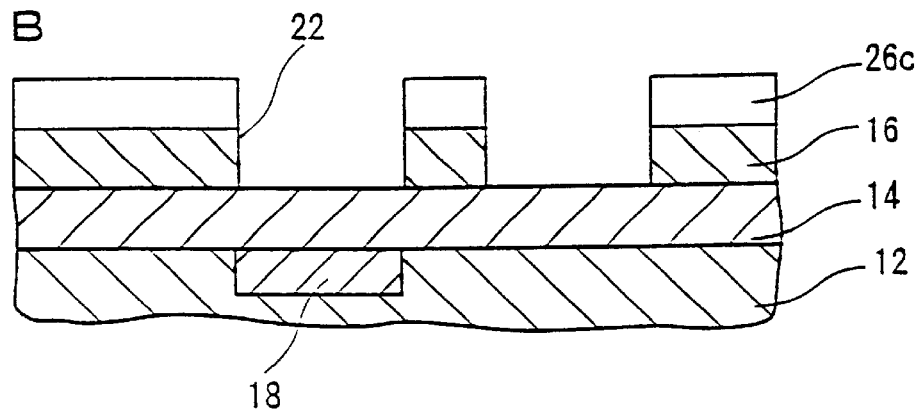

Then, the second interlayer film 16 is masked by and etched through patterned photoresist 26c, thus forming an interconnect trench 22 as shown in Figure 5B. In this etching process, the etching gas or solution should be selected in kind such that the etch rate on the first interlayer film 14 is lower than that of the second interlayer film 16. If doing so, the first interlayer film 14 will serve as an etch stop.

Figure 5C:
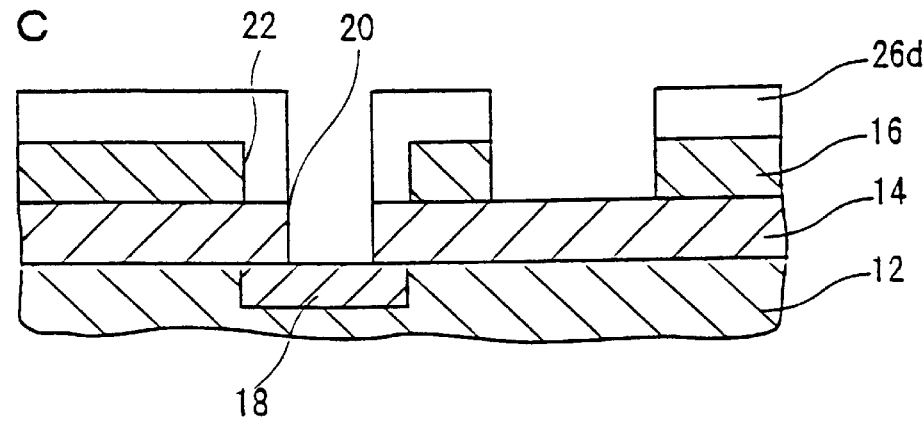
Figure 5D:
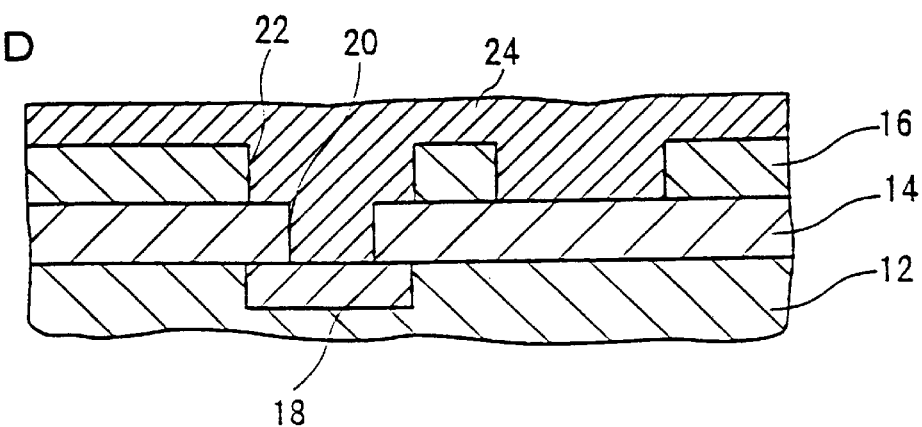
Figure 5E:
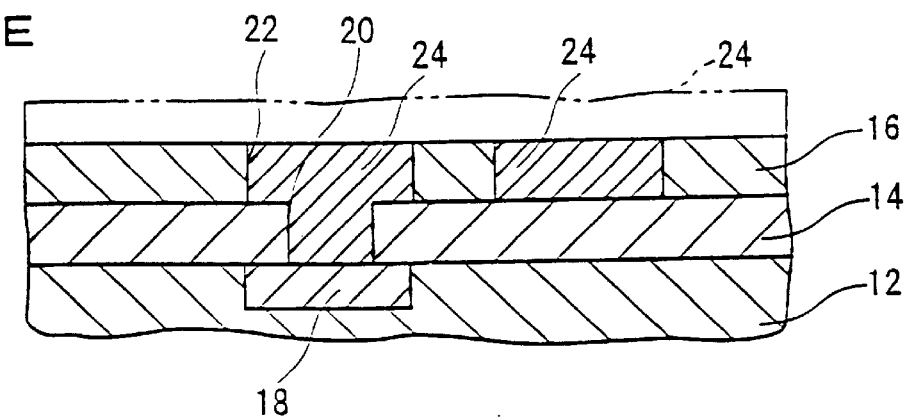

After removing the photoresist 26c, the first interlayer film 14 is masked by and etched through patterned photoresist 26d, as shown in FIG. 5C. Thus a via or contact hole 20 is formed which extends from a bottom of the interconnect trench 22 down to the conductive region 18.

Then, a metal interconnect 24 is formed by spattering a conductive material, such as copper (Cu) or aluminum (Al), or the like, to bury the inside of the contact hole 20 and interconnect trench 22, as shown in FIG. 4D. Finally, the conductive material or metal. interconnect 24 at unwanted portions is removed by implementing a CMP (Chemical-Mechanical Polish) process or the like.

In also this embodiment, when etching the second interlayer film 16, the first interlayer film 14 behaves as an etch stop and diffusion prevention film, thus simplifying the manufacturing process.

Incidentally, in both of the embodiments, known etching gases or solutions are applicable for etching the first interlayer film 14 or the second interlayer film 16.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device with a dual damascene interconnect structure including a first interlayer film and a second interlayer film, and no etch stop between said first interlayer film and said second interlayer film, comprising the steps of:

(a) forming said first interlayer film having an etch rate less than an etch rate of said second interlayer film over a semiconductor substrate;

(b) forming said second interlayer film over a surface of said first interlayer film;

(c) etching said second interlayer film by utilizing said first interlayer film as an etch stop to thereby form an interconnect trench; and (d) etching said first interlayer film to form a contact hole opened to said interconnect trench.

2. A method for manufacturing a semiconductor device with a dual damascene interconnect structure including a first interlayer film and a second interlayer film, and no etch stop between said first interlayer film and said second interlayer film, comprising the steps of:

(a) forming said first interlayer film having an etch rate less than an etch rate of said second interlayer film over a semiconductor substrate;

(b) etching said first interlayer film to form a contact hole;

(c) forming a second interlayer film on a surface of said first interlayer film; and (d) etching said second interlayer film by utilizing said first interlayer film as an etch stop to thereby form an interconnect trench opened to said contact hole.

3. A manufacturing method according to claim 1, wherein said step (a) includes a step to form a film having a high molecular density as said first interlayer film.

4. A manufacturing method according to claim 3, wherein said step (a) includes a step to form a nitride film.

5. A manufacturing method according to claim 2, wherein said step (a) includes a step to form a film having a high molecular density as said first interlayer film.

* * * * *